(12) United States Patent
Lee et al.

(10) Patent No.: US 11,342,893 B2
(45) Date of Patent: May 24, 2022

(54) APPARATUS INCLUDING ELECTRONIC CIRCUIT FOR AMPLIFYING SIGNAL

(71) Applicant: Samsung Electronics Co., Ltd., Suwon-si (KR)

(72) Inventors: Sangmin Lee, Suwon-si (KR); Daehoon Kwon, Suwon-si (KR); Jaehyup Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 16/750,552

(22) Filed: Jan. 23, 2020

(65) Prior Publication Data

US 2020/0244237 A1 Jul. 30, 2020

(30) Foreign Application Priority Data

Jan. 25, 2019 (KR) .................. KR10-2019-0009610

(51) Int. Cl.
*H03F 3/24* (2006.01)
*H03F 1/42* (2006.01)
(Continued)

(52) U.S. Cl.
CPC .............. *H03F 3/245* (2013.01); *H03F 1/42* (2013.01); *H03F 3/45264* (2013.01);
(Continued)

(58) Field of Classification Search
CPC .... H03F 2200/451; H03F 3/245; H03F 1/302; H03F 2200/18; H03F 2200/408; H03F 2200/447; H03F 2200/453; H03F 2200/54; H03F 3/19; H03F 1/30; H03F 3/21; H03F 1/42; H03F 2200/456; H03F 2203/45512;
(Continued)

(56) References Cited

U.S. PATENT DOCUMENTS 5,581,212 A 12/1996 Huang et al.
8,143,957 B2 3/2012 Quan et al.
(Continued)

OTHER PUBLICATIONS

Extended European Search Report dated Jul. 13, 2020, issued in European Application No. 20153320.5-1220.
(Continued)

*Primary Examiner* — Ajibola A Akinyemi
(74) *Attorney, Agent, or Firm* — Jefferson IP Law, LLP (57) ABSTRACT

The apparatus relates to a pre-5th-Generation (5G) or 5G communication system to be provided for supporting higher data rates Beyond 4th-Generation (4G) communication system such as Long-Term Evolution (LTE). The disclosure relates to an apparatus including an electronic circuit for amplifying a signal. The apparatus includes a transceiver including an amplification circuit, and at least one processor coupled to the transceiver. The amplification circuit includes a first path to generate a first current corresponding to a voltage of an input signal, a second path to generate a second current corresponding to a voltage of the input signal, a separation unit to control each of the first current and the second current, a current mirror to generate a third current corresponding to the first current, and a folding unit to generate an output signal on the basis of the second current and the third current.

13 Claims, 7 Drawing Sheets

(51) Int. Cl.
   *H03F 3/45* (2006.01)
   *H04B 1/40* (2015.01)
(52) U.S. Cl.
   CPC ........... *H03F 3/45273* (2013.01); *H04B 1/40* (2013.01); *H03F 2200/451* (2013.01)
(58) Field of Classification Search
   CPC . H03F 2203/45644; H03F 2203/45651; H03F 3/193; H03F 3/45085; H03F 3/45089; H03F 3/45264
   USPC .......................................................... 455/73
   See application file for complete search history.

(56) References Cited

U.S. PATENT DOCUMENTS

| | | | |
|---|---|---|---|
| 8,907,728 B2 | 12/2014 | Watkins | |
| 10,079,582 B2 | 9/2018 | Gathman | |
| 2007/0004368 A1* | 1/2007 | Lee | H03D 7/1458 455/323 |
| 2007/0049234 A1 | 3/2007 | McCorkle et al. | |
| 2009/0091392 A1* | 4/2009 | Yang | H03G 1/0029 330/285 |
| 2012/0019325 A1 | 1/2012 | Shih et al. | |
| 2016/0072447 A1* | 3/2016 | Seth | H03F 1/0233 330/259 |

OTHER PUBLICATIONS

Assaad et al.; The Recycling Folded Cascode: A General Enhancement of the Folded Cascode Amplifier; Sep. 2009.
Thandri et al.; A Robust Feedforward Compensation Scheme for Multistage Operational Transconductance Amplifiers With No Miller Capacitors; Feb. 2003.
Li et al.; Transconductance enhancement method for operational transconductance amplifiers; Electronics Letters; vol. 46 No. 19; Sep. 2010.
Saari et al.; A 240-MHz Low-Pass Filter With Variable Gain In 65-nm CMOS for a UWB Radio Receiver; Jul. 2009.
Shih et al.; A 250 MHz 14 dB-NF 73 dB-Gain 82 dB-DR Analog Baseband Chain With Digital-Assisted DC-Offset Calibration for Ultra-Wideband; Feb. 2010.
Kousai et al.; A 19.7 MHz, Fifth-Order Active-RC Chebyshev LPF for Draft IEEE802.11n With Automatic Quality-Factor Tuning Scheme; Nov. 2007.

* cited by examiner

APPARATUS INCLUDING ELECTRONIC CIRCUIT FOR AMPLIFYING SIGNAL

CROSS-REFERENCE TO RELATED APPLICATION(S)

This application is based on and claims priority under 35 U.S.C. § 119 of a Korean patent application number 10-2019-0009610, filed on Jan. 25, 2019, in the Korean Intellectual Property Office, the disclosure of which is incorporated by reference herein in its entirety.

BACKGROUND

1. Field

The disclosure relates to an electronic circuit. More particularly, the disclosure relates to an apparatus including an electronic circuit for amplifying a signal.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post Long-Term Evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

Generally, an amplifier uses feedback to reduce a gain variation range under process, voltage, and temperature (PVT) conditions. If a feedback factor is referred to as "f" and an open loop gain is referred to as "A", the overall gain of an amplifier is approximated to A/(1+f*A). Therefore, as the open-loop gain increases, the feedback gain approximates 1/f, and thus accurate feedback can be obtained. However, in a broadband amplifier, increasing the gain generally result in increasing bandwidth, and accordingly a phase margin is reduced, and thus stability is lowered. Therefore, in the design of a broadband amplifier, it is very difficult to secure stability while increasing the gain.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus including an electronic circuit for effectively amplifying a signal.

Another aspect of the disclosure is to provide an apparatus including an amplification circuit having a high gain and stability using a feedforward path.

Another aspect of the disclosure is to provide an apparatus including an amplification circuit having low sensitivity and high linearity with respect to process, voltage, and temperature (PVT).

Additional aspects will be set forth in part in the description which follows and, in part, will be apparent from the description, or may be learned by practice of the presented embodiments.

In accordance with an aspect of the disclosure, an apparatus including an electronic circuit is provided. The apparatus includes a transceiver including an amplification circuit and at least one processor coupled to the transceiver. The amplification circuit may include a first path to generate a first current corresponding to a voltage of an input signal, a second path to generate a second current corresponding to the voltage of the input signal, a separation unit to control each of the first current and the second current, a current mirror to generate a third current corresponding to the first current, and a folding unit to generate an output signal on a basis of the second current and the third current.

According to various embodiments, an amount of the second current is greater than an amount of the first current by a first ratio, and an amount of the third current is greater than the amount of the first current by a second ratio. The second path may include a transistor that is larger than transistors included in the first path.

According to various embodiments, the input signal may be input to gates of transistors included in the first path and the second path.

According to various embodiments, the apparatus may further include transistors connected, in a cascode structure, to transistors included in the first path, between the first path and the current mirror.

According to various embodiments, the separation unit may include a first variable transistor connected to the first path and a second variable transistor connected to the second path. A gate of the first variable transistor and a gate of the second variable transistor may be connected to the same bias. A drain of the first variable transistor may be connected to sources of transistors included in the first path, a drain of the second variable transistor may be connected to sources of transistors included in the second path, and sources of the first variable transistor and the second variable transistor may be grounded.

According to various embodiments, the current mirror may include first transistors having the same gain as that of the first path and second transistors having a higher gain than that of the first path, and the first transistors and the second transistors may share a gate voltage.

According to various embodiments, the folding unit may include transistors configured to receive the second current and the third current through the sources and output the output signal through the drains. The folding unit may include resistors connected to body terminals of the transistors.

An apparatus according to various embodiments may secure a wide bandwidth and excellent linearity by separating a path for an amplification operation having broad bandwidth and a path for an amplification operation having higher gain.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, the disclosure relates to an apparatus including an electronic circuit for amplifying a signal. Specifically, a circuit structure of an amplifier having a higher gain and broadband characteristics will be described.

Terms referring to signals, terms referring to materials, terms referring to structures, terms referring to elements of circuits, and the like, which will be used in the following description, are used for convenience of explanation. Accordingly, the disclosure is not limited to the following terms, and other terms having the same technical meanings may be used.

Figure 1:
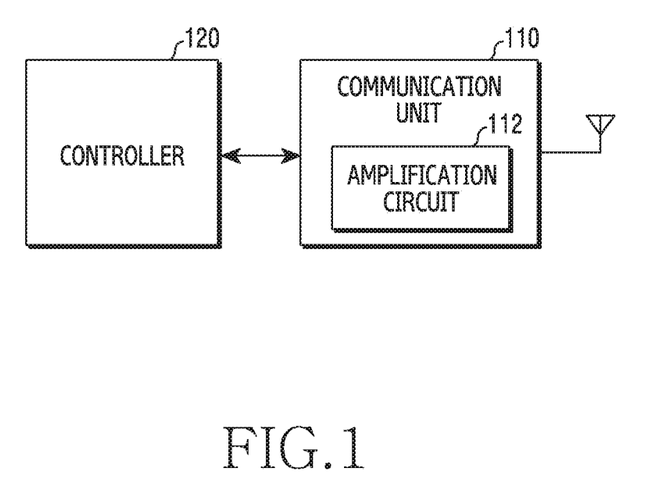
FIG. 1 illustrates an apparatus including an amplification circuit according to an embodiment of the disclosure.

FIG. 1 illustrates an apparatus including an amplification circuit according to an embodiment of the disclosure.

Referring to FIG. 1, an apparatus includes a communication unit 110 (e.g., a transceiver including a transmission unit) and a controller 120 (e.g., at least one processor).

The communication unit 110 performs functions for transmitting or receiving a signal. For example, the communication unit 110 may perform conversion between a bit string and a baseband signal, conversion between an analog signal and a digital signal, conversion between a baseband signal and an intermediate frequency (IF)/radio frequency (RF) signal, and the like. According to various embodiments, the communication unit 110 includes an amplification circuit 112 configured to amplify a transmission signal or a reception signal. The amplification circuit 112 may amplify at least one of a baseband signal, an intermediate frequency band signal, and an RF signal.

The controller 120 controls the overall operation of the apparatus. The controller 120 may provide transmission data to the communication unit 110 and process reception data provided from the communication unit 110. In addition, the controller 120 may determine and control the state of an element (e.g., the amplification circuit 112) included in the communication unit 110. The controller 120 may generate and output a control signal for controlling the communication unit 110. To this end, the controller 120 may include at least one of a processor, a microprocessor, a microcontroller, a memory, and a control signal generation circuit.

Figure 2:
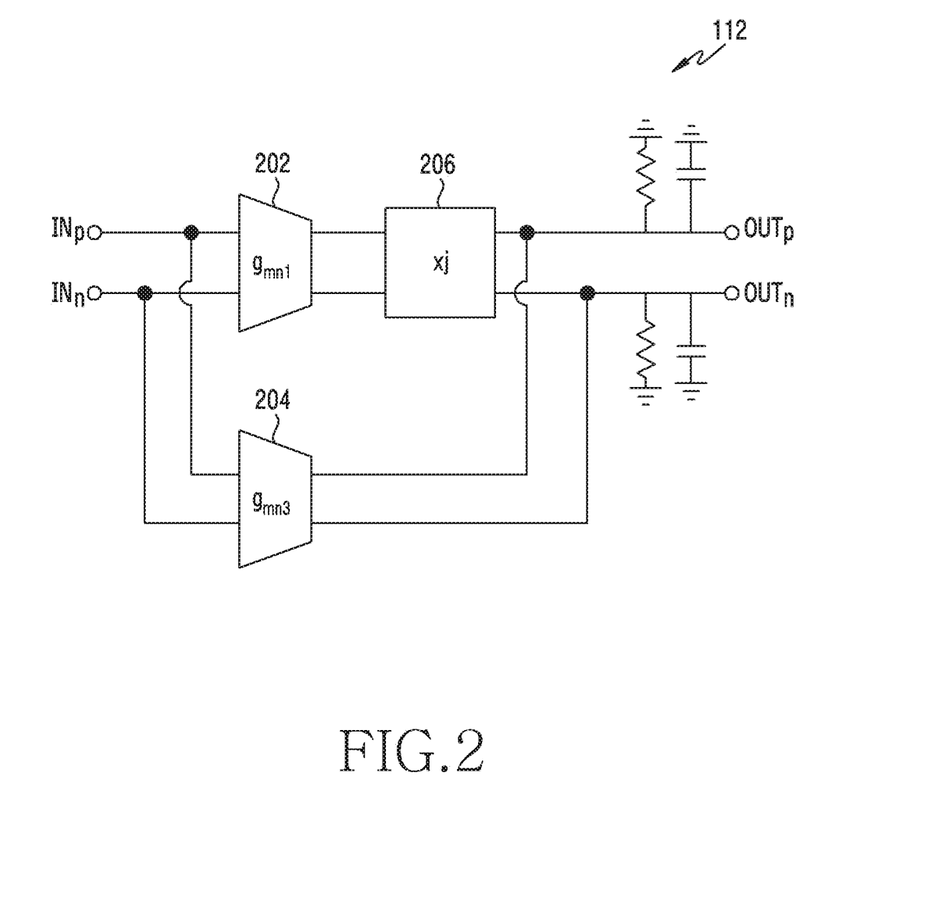
FIG. 2 illustrates the conceptual configuration of an amplification circuit according to an embodiment of the disclosure.

FIG. 2 illustrates the conceptual configuration of an amplification circuit according to an embodiment of the disclosure.

Referring to FIG. 2, the amplification circuit 112 includes a first element 202 configured to provide a gain $g_{mn1}$ and a second element 204 configured to provide a gain $g_{mn3}$. In addition, the amplification circuit 112 includes a third element 206 configured to increase a gain by j times. According to an embodiment, the first element 202 may have relatively higher gain characteristics, and the second element 204 may have relatively broadband characteristics.

Figure 3:
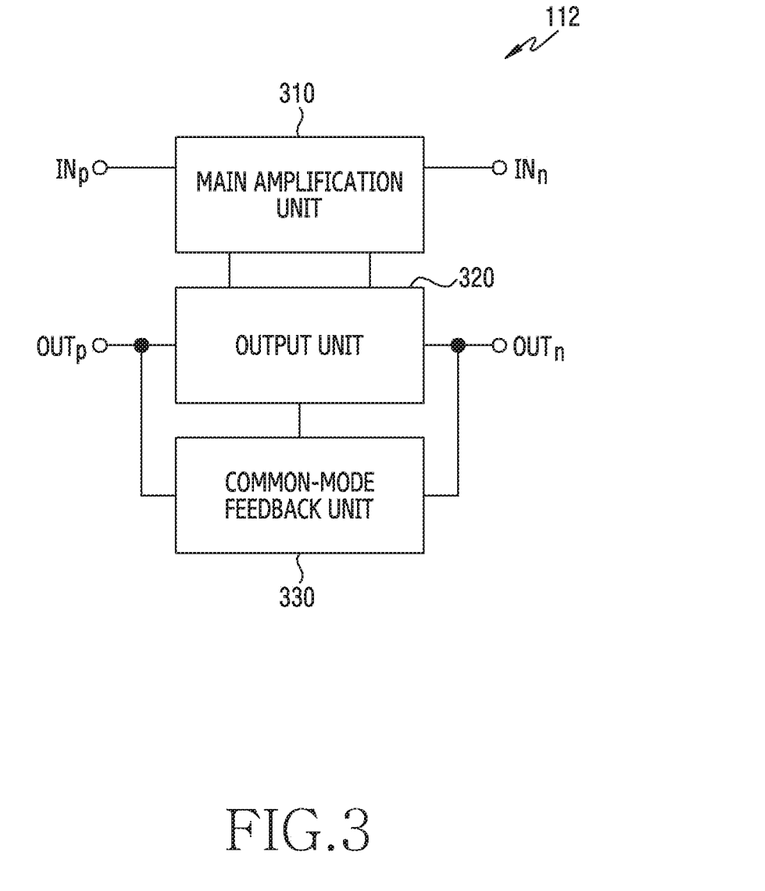
FIG. 3 illustrates the functional configuration of an amplification circuit according to an embodiment of the disclosure.

FIG. 3 illustrates the functional configuration of an amplification circuit according to an embodiment of the disclosure. FIG. 3 further illustrates the configuration of the amplification circuit 112.

Referring to FIG. 3, the amplification circuit 112 includes a main amplifying unit 310, an output unit 320, and a common-mode feedback unit 330.

The main amplifying unit 310 amplifies an input signal input through input terminals $IN_p$ and $IN_n$. The amplified signal is provided to the output unit 320. Here, the input signal may be a differential signal. According to various embodiments, the main amplifying unit 310 may include a part for improving broadband characteristics and a part for improving higher gain characteristics.

The output unit 320 generates an output signal in response to the input signal amplified by the main amplifying unit 310. The output unit 320 has a structure folded with respect to the main amplifying unit 310 in order to secure the headroom of the output circuit.

The common-mode feedback unit 330 is a feedback circuit installed in a bias part of the amplification circuit 112, and generates signals fed back from output terminals $OUT_p$ and $OUT_n$. The common-mode feedback unit 330 may be used to stabilize a common mode of the amplification circuit 112.

Figure 4:
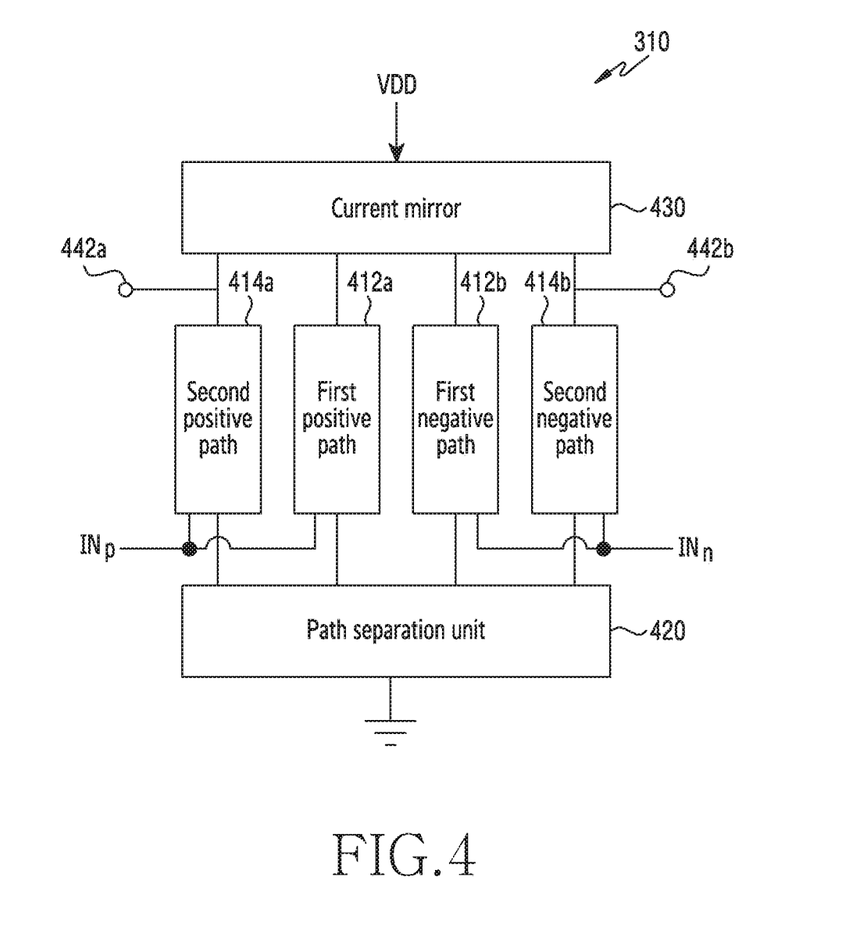
FIG. 4 illustrates a configuration of a main amplifying unit of an amplification circuit according to an embodiment of the disclosure.

FIG. 4 illustrates the configuration of a main amplifying unit of an amplification circuit according to an embodiment of the disclosure. FIG. 4 further illustrates the configuration of the main amplifying unit 310.

Referring to FIG. 4, the main amplifying unit 310 includes a first positive path 412a, a first negative path 412b, a second positive path 414a, a second negative path 414b, a path separation unit 420, and a current mirror 430.

The first positive path 412a and the first negative path 412b generate first currents using input signals. The first positive path 412a generates a current corresponding to the voltage of a positive signal of a differential signal, and the first negative path 412b generates a current corresponding to the voltage of a negative signal of the differential signal. The first positive path 412a and the first negative path 412b may be collectively referred to as a first path.

The second positive path 414a and the second negative path 414b generate second currents using the input signals. The second positive path 414a generates a current corresponding to the voltage of a positive signal of a differential signal, and the second negative path 414b generates a current corresponding to the voltage of a negative signal of the differential signal. Here, the amount of second currents is greater than the amount of first currents. For example, a ratio of the magnitude of the amount of first currents to the magnitude of the amount of second currents may be represented by 1:k. Accordingly, the first positive path 412a and the first negative path 412b may have relatively higher gain characteristics, and the second positive path 414a and the second negative path 414b may have relatively broadband characteristics. The second currents are provided to the output unit 320 through nodes 442a and 442b. The second positive path 414a and the second negative path 414b may be collectively referred to as a second path.

The path separation unit 420 controls the first currents and the second currents. The path separation unit 420 includes a first grounding path for grounding the first positive path 412a and the first negative path 412b, and a second grounding path for grounding the second positive path 414a and the second negative path 414b. The first grounding path may include a circuit for controlling the first currents, and the second grounding path may include a circuit for controlling the second currents. Accordingly, the first currents and the second currents may be independently controlled by means of the path separation unit 420.

The current mirror 430 generates third currents corresponding to first currents generated via the first positive path 412a and the first negative path 414a. Here, the amount of the third currents is greater than the amount of the first currents. For example, a ratio of the magnitude of the first currents to the magnitude of the third currents may be represented by 1:j. The third currents are provided to the output unit 320 via nodes 442a and 442b. Due to the gain of the current mirror 430, the overall gain of the amplification circuit 112 may be increased. In addition, due to the use of the current mirror 430, only one common-mode feedback circuit may be used and a parasitic pole frequency may be higher.

Figure 5:
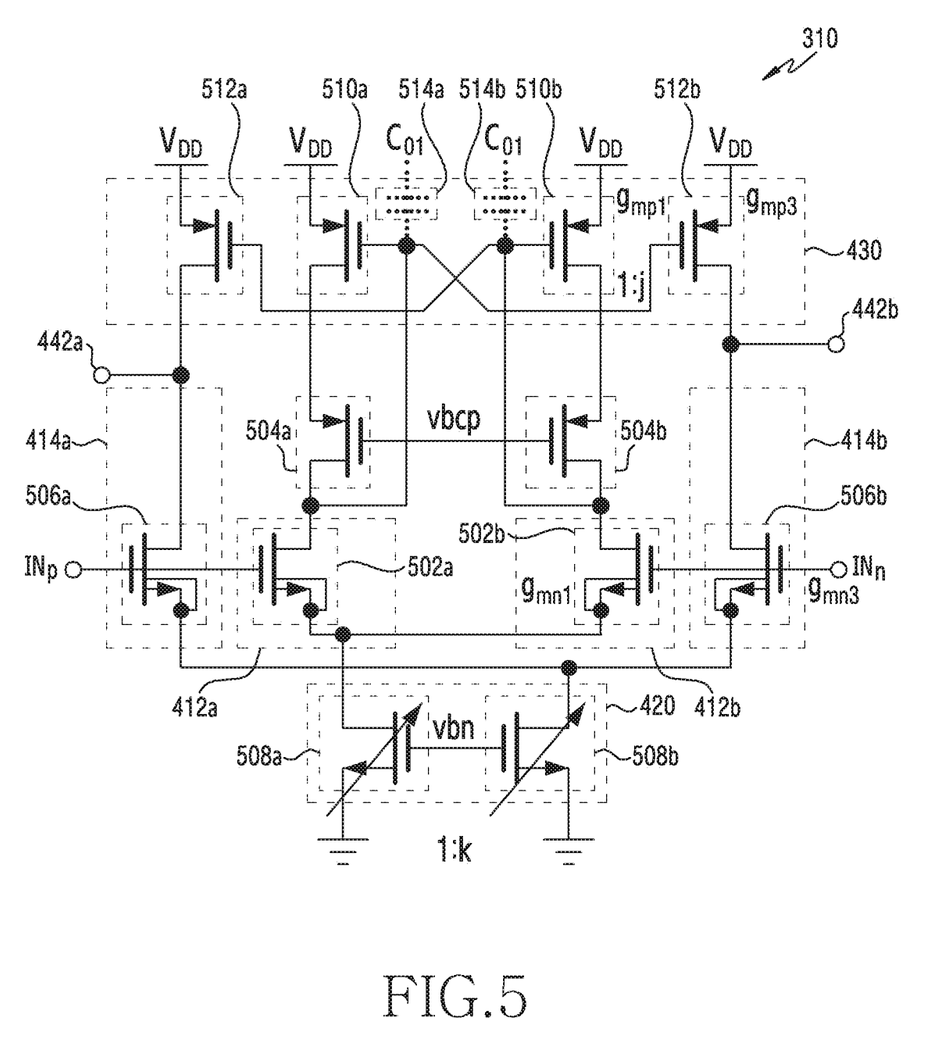
FIG. 5 illustrates an implementation example of a main amplifying unit of an amplification circuit according to an embodiment of the disclosure.

FIG. 5 illustrates an implementation example of a main amplifying unit of an amplification circuit according to an embodiment of the disclosure. FIG. 5 further illustrates a detailed implementation example of a main amplifying unit 310.

Referring to FIG. 5, the main amplifying unit 310 includes a transistor 502a, a transistor 502b, a transistor 504a, a transistor 504b, a transistor 506a, a transistor 506b, a variable transistor 508a, a variable transistor 508b, a transistor 510a, a transistor 510b, a transistor 512a, and a transistor 512b. The transistors 502a, 502b, 506a, 506b, 508a, 508b are n-channel metal oxide semiconductor (NMOS) transistors, and the transistors 504a, 504b, 510a, 510b, 512a, 512b are p-channel metal oxide semiconductor (PMOS) transistors. According to another embodiment, p-type metal-oxide-semiconductor (PMOS) transistors may be replaced with NMOS transistors, and NMOS transistors may be replaced with PMOS transistors.

The first positive path 412a includes the transistor 502a, and the first negative path 412b includes the transistor 502b. Input signals are applied to gates of the transistors 502a and 502b. Drains of the transistors 502a and 502b are connected to drains of the transistors 504a and 504b. Gates of the transistors 504a and 504b are connected to a bias vbcp.

The second positive path 414a includes the transistor 506a, and the second negative path 414b includes the transistor 506b. Input signals are applied to gates of the transistors 506a and 506b. Compared with the transistors 502a and 502b, the ratio of the size of transistors 502a and 502b to the size of transistors 506a and 506b may be 1:k. Drains of the transistors 506a and 506b are connected to nodes 442a and 442b.

The path separation unit 420 includes a variable transistor 508a and a variable transistor 508b. A bias vbn is applied to gates of the variable transistors 508a and 508b, and sources of the variable transistors 508a and 508b are grounded. A drain of the variable transistor 508a is connected to sources of the transistors 502a and 502b, and a drain of the variable transistor 508b is connected to sources of the transistors 506a and 506b. The ratio of the maximum size of the variable transistor 508a to that of the variable transistor 508b may be 1:k.

The current mirror 430 includes a transistor 510a, a transistor 510b, a transistor 512a, and a transistor 512b. $V_{DD}$ is applied to sources of the transistors 510a, 510b, 512a, and 512b. Gates of transistors 510a and 510b are connected to gates of transistors 512a and 512b. That is, transistors 510a and 512b share a gate voltage, and transistors 510b and 512a share a gate voltage. Drains of the transistors 510a and 510b are connected to sources of the transistors 504a and 504b. Drains of transistors 512a and 512b are connected to nodes 422a and 422b.

Each of the variable transistors 508a and 508b is variable to adjust the amount of corresponding current. For example, each of the variable transistors 508a and 508b includes a plurality of NMOS transistors, and may have a structure in which some or all of the NMOS transistors are turned on depending on the intended amount of current. By the control of the variable transistors 508a and 508b, the gains $g_{mn1}$ and $g_{mn3}$ can be adjusted. In addition, by the control of the variable transistors 508a and 508b, the gain and bandwidth of the amplification circuit 112 can be adjusted.

Parasitic capacitances 514a and 514b may be configured in gates of the transistors 510a and 510b.

The characteristics of the circuit illustrated in FIG. 5 will be described with reference to the following equations.

$$\frac{g_{mp1}}{g_{mp3}} = \frac{i}{j}, \frac{g_{mn1}}{g_{mn3}} = \frac{1}{k} \qquad \text{(Equation 1)}$$

In Equation 1, $g_{mp1}$ denotes the gain of a current mirror corresponding to a first path, $g_{mp3}$ denotes the gain of a current mirror corresponding to a second path, j denotes a ratio between gains of current mirrors, $g_{mn1}$ is a gain of the first path, $g_{mn3}$ denotes a gain of the second path, and k denotes a gain ratio between the first path and the second path.

Here, the overall gain of the amplification circuit 112 is defined by Equation 2 as follows.

$$H(s) = \frac{(j+k)g_{mn1}r_{o2}\left[\dfrac{1+sC_{o1}}{\left(\dfrac{j}{k}+1\right)g_{mp1}}\right]}{\left(1+\dfrac{sC_{o1}}{g_{mp1}}\right)\left(1+\dfrac{sC_{o2}}{g_{o2}}\right)} \qquad \text{(Equation 2)}$$

In Equation 2, H(s) denotes a transfer function of the amplification circuit 112, j denotes a gain ratio of a current mirror, k denotes a gain ratio between a first path and a second path, $g_{mn1}$ denotes a gain of the first path, $r_{o2}$ denotes a parasitic resistance at an output terminal, $C_{o1}$ denotes a parasitic capacitance 514b, $g_{mp1}$ denotes a gain of a current mirror corresponding to the first path, $C_{o2}$ denotes a parasitic capacitance at an output terminal, and $g_{o2}$ denotes an inverse of $r_{o2}$.

Each term included in the transfer function of Equation 2 may be defined by Equation 3.

$$\omega_{z,LHP} = \frac{\left(\dfrac{j}{k}+1\right)g_{mp1}}{C_{o1}}, \omega_{p1} = \frac{g_{mp1}}{C_{o1}}, \omega_{p2} = \frac{1}{r_{o2}C_{o2}} \qquad \text{(Equation 3)}$$

In Equation 3, $\omega_{z,LHP}$ denotes a frequency corresponding to a left-half-plane (LHP) zero, j denotes a gain ratio of a current mirror, k denotes a gain ratio between a first path and a second path, $g_{mp1}$ denotes a gain of a current mirror corresponding to the first path, $C_{o1}$ denotes a parasitic capacitance 514b, $\omega_{p1}$ denotes a frequency at which a first pole occurs, ωp2 denotes a frequency at which a second pole occurs, $r_{o2}$ denotes parasitic resistance at an output terminal, and $C_{o2}$ denotes parasitic capacitance at an output terminal.

Here, if $\omega_{z,LHP}$ cancels $\omega_{p2}$, a low frequency gain may be defined by Equation 4 as follows.

$$G_{DC} = (j+k)g_{mn1}r_{o2}, \qquad \text{(Equation 4)}$$
$$GBW(\text{gain bandwidth}) = \frac{(j+k)g_{mn1}r_{o2}g_{mp1}}{C_{o1}}$$

In Equation 4, $G_{DC}$ denotes a low frequency gain, j denotes a gain ratio of a current mirror, k denotes a gain ratio between a first path and a second path, $g_{mn1}$ denotes a gain of the first path, $r_{o2}$ denotes parasitic resistance at an output terminal, GBW denotes a gain bandwidth, $g_{mp1}$ denotes a gain of a current mirror corresponding to the first path, and $C_{o1}$ denotes parasitic capacitance 514b.

Figure 6:
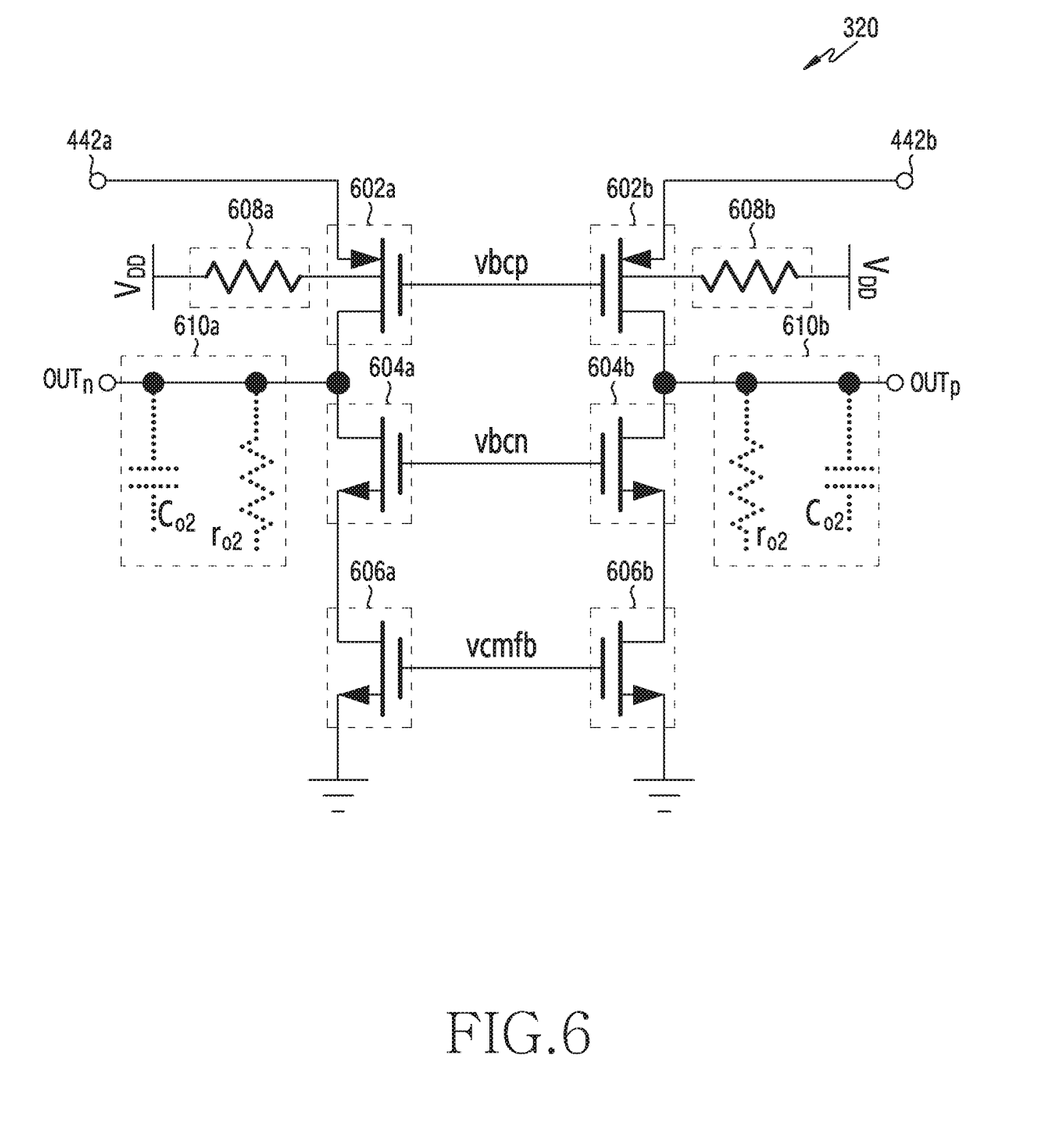
FIG. 6 illustrates an implementation example of an output unit of an amplification circuit according to an embodiment of the disclosure.

FIG. 6 illustrates an implementation example of an output unit of an amplification circuit according to an embodiment of the disclosure. FIG. 6 further illustrates an implementation example of an output unit 320.

Referring to FIG. 6, the output unit 320 includes a transistor 602a, a transistor 602b, a transistor 604a, a transistor 604b, a transistor 606a, a transistor 606b, a resistor 608a, and a resistor 608b. The transistors 602a and 602b are PMOS transistors, and the transistors 604a, 604b, 606a, and 606b are NMOS transistors. According to another embodiment, PMOS transistors may be replaced with NMOS transistors, and NMOS transistors may be replaced with PMOS transistors.

A bias vbcp is applied to gates of the transistors 602a and 602b, a bias vbcn is applied to gates of the transistors 604a and 604b, and a bias vcmfb is applied to gates of the transistors 606a and 606b. Sources of the transistors 602a and 602b are connected to nodes 442a and 442b, and drains of transistors 602a and 602b are connected to output terminals $OUT_n$ and $OUT_p$. That is, the transistors 602a and 602b receive an input signal through sources and output an output signal through drains. One node of each of the resistors 608a and 608b is connected to a body terminal of a corresponding one of the transistors 602a and 602b, and $V_{DD}$ is applied to the other nodes of the resistors 608a and 608b. Drains of transistors 604a and 604b are respectively connected to output terminals $OUT_n$ and $OUT_p$, and sources of transistors 604a and 604b are respectively connected to drains of transistors 606a and 606b. Sources of transistors 606a and 606b are grounded.

Referring to FIGS. 5 and 6, transistors 504a, 504b, 602a, and 602b have cascode structure with transistors 510a, 510b, 512a, and 512b. Further, the transistors 504a, 504b, 602a, and 602b maintain the voltages of drains of the transistors 510a, 510b, 512a, and 512b included in a current mirror 430 constant, so as to maintain a current split ratio of the current mirror 430. In addition, the transistors 504a, 504b, 602a, 602b improve a gain by increasing the load impedance of the first positive path 412a, the first negative path 412b, the second positive path 414a, and the second negative path 414b.

Resistors 608a and 608b are arranged between a $V_{DD}$ terminal and the transistors 602a and 602b, thereby functioning as high-impedance body biasing to the transistors 602a and 602b. Accordingly, the high frequency characteristics of the amplification circuit 112 can be improved. Transistors 604a and 604b and transistors 606a and 606b configure output impedance.

Parasitic elements 610a and 610b may be configured at the output terminals $OUT_n$ and $OUT_p$. The parasitic elements 610a and 610b may respectively be represented by a capacitor and a resistor connected in parallel.

Figure 7:
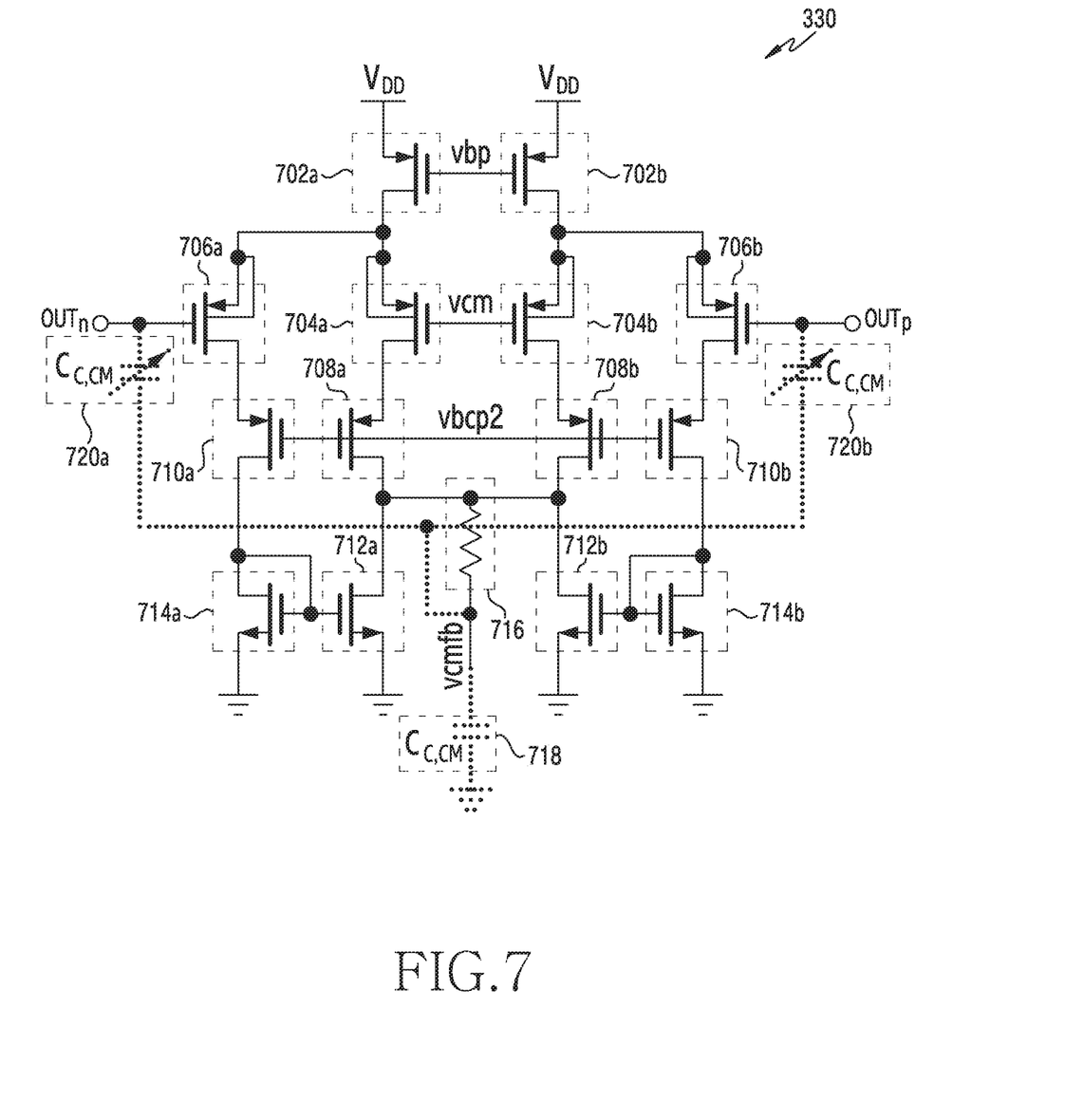
FIG. 7 illustrates an implementation example of a common-mode feedback unit of an amplification circuit according to an embodiment of the disclosure.

FIG. 7 illustrates an implementation example of a common-mode feedback unit of an amplification circuit according to an embodiment of the disclosure. FIG. 7 further illustrates an implementation example of the common-mode feedback unit 330.

Referring to FIG. 7, a common-mode feedback unit 330 includes transistors 702a, 702b, 704a, 704b, 706a, 706b, 708a, 708b, 710a, 710b, 712a, 712b, 714a, and 714b, and a resistor 716. The transistors 702a, 702b, 704a, 704b, 706a, 706b, 708a, 708b, 710a, 710b are PMOS transistors, and transistors 712a, 712b, 714a, 714b are NMOS transistors. According to another embodiment, PMOS transistors may be replaced with NMOS transistors, and NMOS transistors may be replaced with PMOS transistors.

A bias vbp is applied to gates of the transistors 702a and 702b, a bias vcm is applied to gates of the transistors 704a and 704b, a bias vbcp2 is applied to gates of the transistors 708a and 708b, and a bias vbcp2 is applied to gates of the transistors 710a and 710b. The common-mode feedback unit 330 generates a bias vcmfb through the resistor 716 and applies a bias vcmfb to a main amplifier. $V_{DD}$ is applied to sources of transistors 702a and 702b. Sources of the transistors 704a and 704b are connected to drains of the transistors 702a and 702b, and drains of the transistors 704a and 704b are connected to sources of the transistors 708a and 708b. Sources of the transistors 706a and 706b are connected to the sources of transistors 704a and 704b, and gates of the transistors 706a and 706b are connected to output terminals $OUT_n$ and $OUT_p$.

Drains of the transistors 708a and 708b are interconnected and are also connected to the other node of the resistor 716. Sources of transistors 710a and 710b are connected to drains of transistors 706a and 706b. Drains of the transistors 712a and 712b are connected to the other node of the resistor 716, and sources of the transistors 712a and 712b are grounded. Gates of transistors 714a and 714b are connected to gates of transistors 712a and 712b, drains of transistors 714a and 714b are connected to drains of transistors 710a and 710b, and sources of transistors 714a and 714b are grounded.

A capacitor 718 may be connected to one node of the resistor 716 for stabilization. In addition, capacitors 720a and 720b may be connected to the output terminals $OUT_n$ and $OUT_p$ via the vcmfb for stabilization.

Methods according to embodiments stated in claims and/or specifications of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other types of optical storage devices, or a magnetic cassette. Alternatively, any combination of some or all thereof may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

Further, multiple elements expressed in the description may be configured into a single element, or a single element in the description may be configured into multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An apparatus comprising an electronic circuit, the apparatus comprising:
    a transceiver including an amplification circuit; and
    at least one processor coupled to the transceiver,
    wherein the amplification circuit comprises:
        a main amplifying circuit to amplify an input signal input through input terminals, comprising:
            a first path to generate a first current corresponding to a voltage of an input signal,
            a second path to generate a second current corresponding to the voltage of the input signal, wherein an amount of the second current is greater than an amount of the first current,
            a separation unit to control each of the first current and the second current, and
            a current mirror to generate a third current corresponding to the first current, wherein an amount of the third current is greater than the amount of the first current,
        an output circuit comprising a folding unit to generate an output signal on a basis of the second current and the third current, and
        a common-mode feedback circuit to generate a feedback signal from the output signal, and
    wherein the output circuit is in communication with the main amplifying circuit and the common-mode feedback circuit.

2. The apparatus of claim 1, wherein the second path includes a transistor that is larger than transistors included in the first path.

3. The apparatus of claim 1, wherein the input signal is input to gates of transistors included in the first path and the second path.

4. The apparatus of claim 1, further comprising:
    transistors connected, in a cascode structure, to transistors included in the first path, between the first path and the current mirror.

5. The apparatus of claim 1, wherein the separation unit comprises:
    a first variable transistor connected to the first path, and
    a second variable transistor connected to the second path.

6. The apparatus of claim 5,
    wherein a gate of the first variable transistor and a gate of the second variable transistor are connected to the same bias,
    wherein a drain of the first variable transistor is connected to sources of transistors included in the first path,
    wherein a drain of the second variable transistor is connected to sources of transistors included in the second path, and
    wherein sources of the first variable transistor and the second variable transistor are grounded.

7. The apparatus of claim 1,
    wherein the current mirror comprises:
        first transistors having the same gain as that of the first path, and
        second transistors having a higher gain than that of the first path, and
    wherein the first transistors and the second transistors share a gate voltage.

8. The apparatus of claim 1, wherein the folding unit comprises transistors configured to:
   receive the second current and the third current through sources, and
   output the output signal through drains.

9. The apparatus of claim 8, wherein the folding unit comprises resistors connected to body terminals of the transistors.

10. The apparatus of claim 1, wherein the main amplifying circuit further comprises:
    a first part to improve broadband characteristics, and
    a second part to improve higher gain characteristics.

11. The apparatus of claim 1, wherein the common-mode feedback circuit comprises a feedback circuit installed in a bias part of the amplification circuit.

12. The apparatus of claim 1, wherein the output circuit comprises a structure folded with respect to the main amplifying circuit to secure headroom of the output circuit.

13. The apparatus of claim 1,
    wherein the common-mode feedback circuit comprises a feedback circuit installed in a bias part of the amplification circuit, and
    wherein the common-mode feedback circuit is configured to:
       generate feedback signals from the output signal, and
       stabilize a common mode of the amplification circuit.

* * * * *